United States Patent
Yamazaki

[19]

[11] Patent Number: 5,932,524
[45] Date of Patent: Aug. 3, 1999

[54] METHOD OF MANUFACTURING SUPERCONDUCTING CERAMICS

[75] Inventor: Shunpei Yamazaki, Tokyo, Japan

[73] Assignee: Semiconductor Energy Laboratory Co., Ltd., Kanagawa, Japan

[21] Appl. No.: 07/590,493

[22] Filed: Sep. 27, 1990

Related U.S. Application Data

[63] Continuation of application No. 07/172,422, Mar. 23, 1988, abandoned.

[30] Foreign Application Priority Data

Mar. 23, 1987 [JP] Japan ................................. 62-69446
Mar. 27, 1987 [JP] Japan ................................. 62-75203
Mar. 27, 1987 [JP] Japan ................................. 62-75204

[51] Int. Cl.$^6$ .................................................. C04B 35/64
[52] U.S. Cl. .................... 505/430; 505/725; 505/739; 505/740; 505/815; 505/822; 505/490; 264/434
[58] Field of Search .................... 264/27, 24, 25, 264/434; 505/725, 739, 1, 740, 815, 822, 430, 490

[56] References Cited

U.S. PATENT DOCUMENTS 4,939,121 7/1990 Rybka ..................................... 264/434
4,975,412 12/1990 Okzzaki et al. ........................ 505/725

FOREIGN PATENT DOCUMENTS 61-023306 1/1986 Japan .
61-276305 12/1986 Japan .

OTHER PUBLICATIONS

Sorimachi et al, Japanese Journal of Applied Science vol. 26, No. 9, Sep. 1987 <1451–<1452.
Djurek et al, "Sintering of a Mixed Phase YBa CuO in a Pulsed Electric Field"; Europhys Lett. (4)(10), pp. 1195–1198 Nov. 1987.
Zeitschrift für Physik B—Condensed Matter, vol. 66, No. 3, Mar. 10, 1987, pp. 141–146, Springer–Verlag; C. Politis et al.: "Superconductivity at 40 K in Lal.8Sr0.2Cu04", *pp. 141–143, II experimental procedures*.
Materials ResearchBulletin, vol. 20, No. 6, 1985, pp. 667–671, Pregamon Press Ltd., C. Michel et al.: "The oxygen defect perovskite BaLa4Cu5O13.4, A Metallic Conductor", *pp. 667–668, paragraph 3.
Zeitshcrift für Physik B—Condensed Matter, vol. 64, 1986, Springer–Verlag; J.G. Bednorz et al.: "Possible High $T_c$ Superconductivity in the Ba–La–Cu–O System".

*Primary Examiner*—James Derrington
*Attorney, Agent, or Firm*—Sixbey, Friedman, Leedom & Ferguson, P.C.; Gerald J. Ferguson, Jr.; Jeffrey L. Costellia

[57] ABSTRACT

A high Tc superconducting ceramic material is produced by a method in which a mixture of chemicals in suitable amounts is compacted into a desired form. The compacted mixture is then fired and, at the same time, an electric current is caused to pass through the compacted mixture in a predetermined direction. By virtue of the passage of the current through the material during firing, the orderliness of the molecular arrangement is enhanced and an elevated transition temperature Tc is obtained.

31 Claims, 2 Drawing Sheets

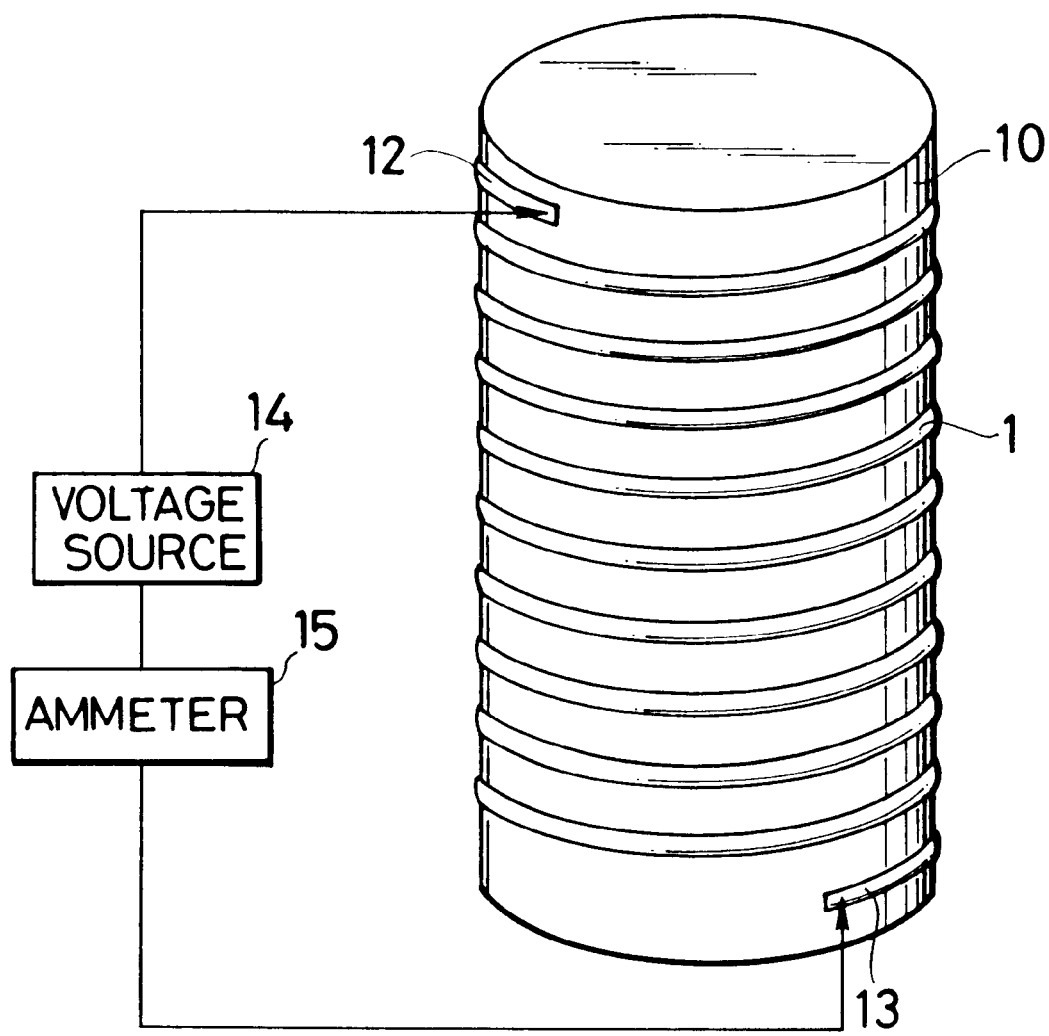

METHOD OF MANUFACTURING SUPERCONDUCTING CERAMICS

This application is a Continuation of Ser. No. 07/172,422, filed Mar. 23, 1988, now abandoned.

BACKGROUND OF THE INVENTION

This invention relates generally to the field of superconducting ceramics and particularly to manufacturing methods for making superconducting ceramics.

It has long been known that metals such as mercury and lead, intermetallics such as NbNd, $Nb_3Ge$ and $Nb_3Ga$ and ternary materials such as $Nb_3(Al_{0.8}Ge_{0.2})$ demonstrate superconductivity. However, the transition temperature of such long known superconducting materials cannot exceed 25° K.

In more recent years, superconducting ceramics have attracted widespread interest. A new material was first reported by researchers at the Zurich laboratory of IBM Corp. as Ba-La-Cu-O-type high temperature superconducting oxides. Subsequently, La-Sr-Cu(II)-O-type superconducting oxides were also proposed. Another type of superconducting material that has been found is $(YBa_2)Cu_3O_{6-8}$. By virtue of the fact that these superconducting ceramics form a quasi-molecular atomic unit in a crystalline structure whose unit cell is constructed with one layer in which electrons have essentially one-dimensional motion, whereas only three-dimensional electron conduction occurs in the long known materials mentioned above, higher transition temperatures are achieved.

Much work has been undertaken by researches in this field who have endeavoured to elevate Tco, the temperature at which resistance vanishes, above the levels previously obtained and preferably above the boiling point of nitrogen (77° K.) or even higher. As described in our European Patent Application No. 87309081.5 we have investigated superconducting ceramics materials having the stoichiometric formulae $(A_{1-x}B_x)_yCu_zO_w$, where A represents one or more elements of Group IIIb of the Periodic Table, e.g. the rare earth elements, and B represents one or more elements of Group IIa of the Periodic Table, e.g. the alkaline earth elements including beryllium and magnesium, and in the continuation of these investigations we have discovered that the existence of voids and grain boundaries in superconducting ceramic materials makes it difficult to obtain an elevated Tco.

OBJECTS AND SUMMARY OF THE INVENTION

The present invention thus seeks to provide superconducting ceramics having a higher transition temperature than hitherto and to manufacture superconducting ceramics substantially devoid of imperfections.

Whereas in previous attempts to find higher Tc superconducting materials attention has been focussed upon the composition or molar ratios of the constituent elements, in accordance with the present invention there is principally provided an improved process for the manufacture of superconducting ceramics in accordance with which, during the firing of the raw ceramic constituents, that is to say the chemical compounds which are mixed together to form the superconducting ceramic, an electric current is passed therethrough. By virtue of the passage of this current, it has been found that the ceramic mixture can be given a special orientation in which the atomic arrangement is ordered and made more simple, e.g on the (a,b) plane, so that few grain boundaries and imperfections exist in the final ceramic material.

Whilst the exact mechanism whereby this advantageous effect is obtained is not fully understood, one possibility is that, analogous to the molecular motion which occurs in a magnetic substance in response to the application of a magnetic field thereto, the dipole moments in superconducting ceramics materials may be oriented by the application thereto of an electric field so as to result in a well-arranged structure.

Other features of the invention are set forth with particularity in the appended claims and will become clear to those possessed of the relevant skills from consideration of the following description of exemplary embodiments given with reference to the accompanying drawings.

BRIEF DESCRIPTION OF THE DRAWINGS

FIG.2 is a perspective view showing a method of manufacturing a superconducting coil.

DETAILED DESCRIPTION OF THE PREFERRED EMBODIMENTS

Figure 1:
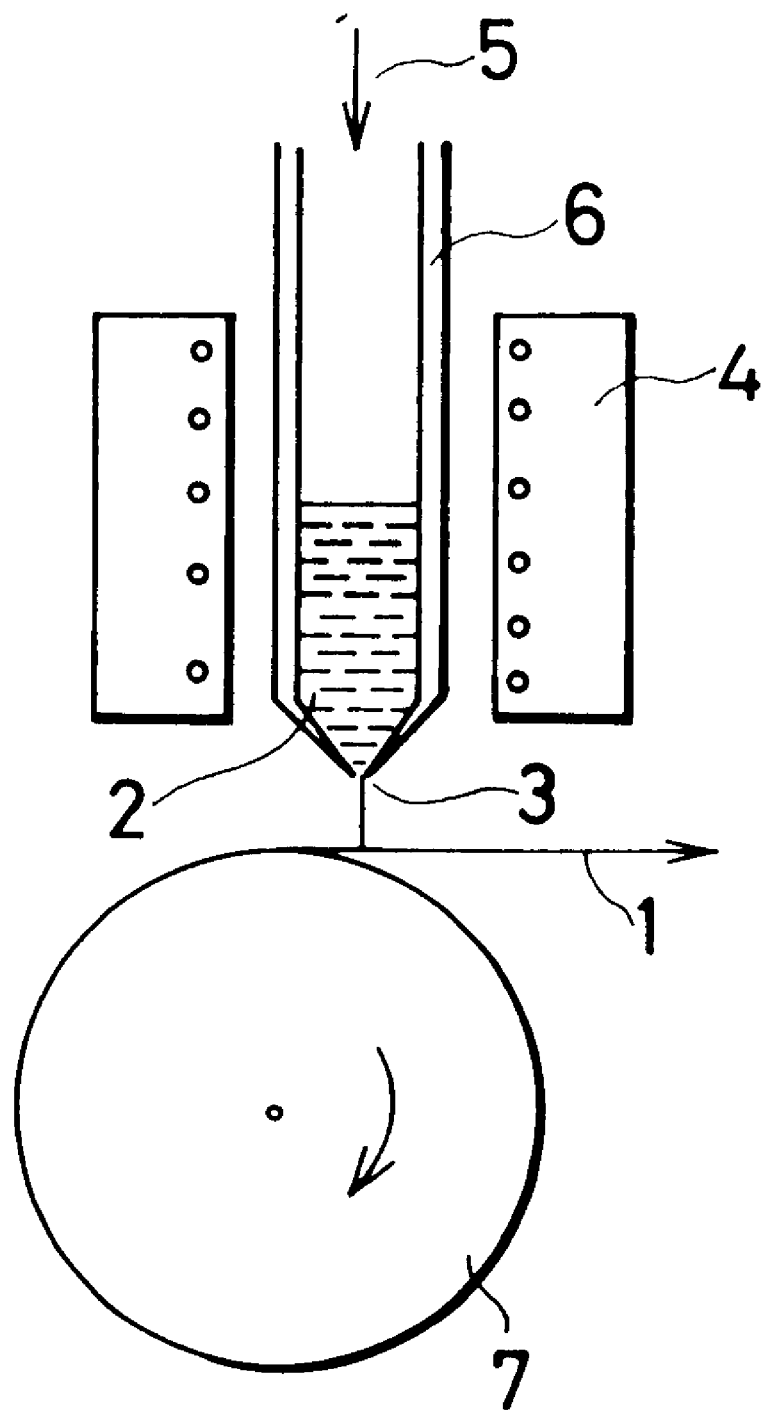
FIG.1 is a cross sectional view showing an exemplary apparatus used in the manufacture of superconducting ceramics in accordance with the present invention.

First described hereinafter are a number of examples illustrating the manufacture by a method according to the present invention of superconducting ceramics confirming to the stoichiometric formulae $(A_{1-x}B_x)_yCu_zO_w$, where A is one or more elements of Group IIIb of the Periodic Table, e.g. the rare earth elements, B is one or more elements of Group IIa of the Periodic Table, e.g. the alkaline earth metals including beryllium and magnesium, and x=0.1–1.0; y=2.0–4.0 (preferably 2.5–3.5); z=1.0–4.0 (preferably 1.5–3.5); and w=4.0–10.0 (preferably 6.0–8.0).

It will be seen from consideration of these examples that the application of a voltage to a superconducting ceramic material during firing can result in a transition temperature Tc as high as 117° K. The direction in which the voltage was applied was chosen to be coincident with the direction in which current would be desired to pass through the superconducting material in use thereof.

Example 1

Prescribed amounts of $BaCO_3$, CuO and $Y_2O_3$ (High Purity Chemical Industries Co.Ltd. 99.95% or higher) were used for preparing a superconducting ceramic material of the above formula where x=0.67, y=3, z=3 and w=6–8, i.e., in conformance with $(YBa_2)_3$ $Cu_3O_{6-8}$. The factor "w" was controlled by adjusting the sintering conditions.

After being mixed in a ball mill, the high purity chemicals were pressed in a capsule at 30 Kg/cm² and formed into a cylindrical shaped tablet of 5 mm diameter and 15 mm height. The tablet was heated (fired) and oxidized at 500–1200°C., e.g. 700°C., for 8 hours in an oxidizing atmosphere such as in air, this step being called pre-firing hereinafter.

Next, the tablet was finely ground in a ball mill to an average grain diameter of not more than 200 microns and preferably 20 microns or less, e.g. 10 microns or smaller. Then, the powder was pressed in a capsule at 50 Kg/cm² to form a cylindrical tablet again.

The tablets were then fired, hereinafter called main-firing, for 10–50 hours at 500–1200° C., for example 15 hours at 900° C., in an oxidizing atmosphere such as air. At the same time, electric power was applied to the tablet so that pulsed electric current passed through the cylindrical tablet in the axial direction at 0.5–150 A/cm², for example 8 A/cm². Namely, the current flowed intermittently through the tablets for about 5 hours with 30 seconds in pulse width and 5 minutes interval between pulses.

Then, the tablets were heated and reduced in an $O_2$ atmosphere with 5–20 atom % Ar at 600–1200° C. for 3–30 hours, for example at 800° C. for 20 hours. The relationship between the temperature and the resistance was investigated, and as a result the highest Tc onset temperature and Tco were measured to be 117° K. and 99° K. respectively.

Example 2

The same mixture was prepared as in the previous example. After being mixed in a ball mill, the high purity chemicals were pressed in a capsule at 30 Kg/cm² and formed into a cylindrical tablet of 5 mm diameter and 15 mm height. The tablet was then pre-fired by being heated and oxidized at 500–1200° C., e.g 700° C., for 8 hours in an oxidizing atmosphere such as in air.

Next, the tablet was finely ground in a ball mill to an average grain diameter of not more than 200 microns and preferably 20 microns or less, e.g. 10 microns or smaller. Then, the powder was dispersed into a printing solution and was deposited on the surface of a supporting cylinder by screen press printing, offset printing, intaglio or the like in the form of a coil as illustrated in FIG.2.

Main-firing was then carried out with the tablets for 10–50 hours, for example 15 hours, at 500–1200° C., e.g. 900° C., in an oxidizing atmosphere such as air. At the same time, electric power was applied to the coils so that pulsed electric current passed through the coils in the axial direction at 0.5–150 A/cm², for example 8 A/cm². Namely, the current flowed intermittently through the coils for about 5 hours with 30 seconds in pulse width and 5 minutes interval between pulses.

Then, the coils were heated and reduced in an $O_2$ atmosphere with a 5–20 atoms % Ar at 600–1200° C. for 3–30 hours, for example at 800° C. for 20 hours. The relationship between the temperature and the resistance was investigated, and as a result the highest Tc onset temperature and Tco were measured to be 95° K. and 79° K. respectively.

Example 3

In accordance with this example, Yb and Ba were selected as "A" and "B" of the above formula. The samples were prepared from $BaCO_3$, CuO and $Yb_2O_3$ in amounts such as to yield a molar ratio of x=0.67, y=3, z=3 and w=6–8 in the formula, the value of "w" being controlled during oxidation or reducing steps.

The chemicals were mixed together and the mixture 2 was put in a furnace shown in FIG.1 as comprising a container 6 and a heater 4 and melted at up to 2000° K. The molten material 2 was injected on to the surface of a roll 7 through a nozzle 3 by means of the high pressure of air 5 compressed by means of an air piston (not shown) provided for the container 6, and cooled rapidly in a strip on the surface of the roll 7 which was turned at high speed. The strip was then wound around a supporting cylinder 10 in the form of a coil (multi-layered or single-layered).

The strip 1 was heated and oxidized in an oxidizing atmosphere at 500–1200° C., for example 900° C., and was then reduced for controlling the proportion of oxide (or others) in the product. The firing continued for 3–50 hours, for example 10 hours. An electric current was passed through the strip 1 at 0.5–150 A/cm² from one end 12 to the othr end 13 of the strip 1 by means of a voltage source 14 and an ammeter 15. Because of a comparatively low resistivity of $10^{-3}$ to $10^{-5}$ ohm cm$^{-1}$, the resistance of the strip was as low as 1 ohm. The Tco of the strip in the form of a coil was measured to be 98° K. The Tc was 115° K.

Example 4

Example 3 was repeated except that the roll 7 was used also as the supporting cylinder. Namely, the melted mixture was cooled and wound up simultaneously by the roll 7. In this example, current treatment was carried out also during the cooling and winding step by applying a voltage between the container 6 and the roll 7 so that a current flow is produced within the molten mixture as it flows from the container 6 onto the roll 7. After the aforementioned firing described in Example 3 was completed, there was obtained a superconducting coil whose Tc onset temperature was improved by a further 3–5° K.

For enhancing the layered arrangement of the copper atoms in the crystalline structure according to this embodiment, small quantities of elements from Group IIIa of the Periodic Table may be mixed additionally into the mixture. With this addition, voids or other imperfections can be eliminated almost perfectly and therefore the Tc onset and the Tco can be elevated further.

There will now be described below examples of the manufacture by a process according to the present invention of superconducting ceramic materials according to the stoichiometric formula generally expressed by $(A_{1-x}B_x)_y CuO_z$, where A is one or more elements of Group IIIb of the Periodic Table, e.g. the rare earth elements, B is one or more elements of Group IIa of the Periodic Table, e.g. the alkaline earth metals including beryllium and magnesium and wherein x=0.01–0.3, y=1.0–2.2, and z=2.0–4.5. With this molar ratio, superconducting ceramics are formed in a double layered symmetric structure, such as a $K_2NiF_4$ structure or a perovskite-like structure modified therefrom. High purity (99.9% or 99.99%) oxides and/or carbonates are used as starting materials and are ground into fine powders and mixed together so that the prescribed molar ratios of x, y and z can be obtained.

Example 5

Prescribed amounts of $BaCO_3$, CuO and $Y_2O_3$ (High Purity Chemical Industries Co.Ltd. 99.95% or higher) were used for preparing a superconducting material of the above formula where x-0.08 and y=1.8. This example was repeated with varying values of "x" ranging from 0.01 to 0.3, i.e. 0.05, 0.1, 0.15, and 0.2.

After being mixed in a ball mill, the high purity chemicals were pressed in a capsule at 3 Kg/cm² and formed into a cylindrical tablet of 5 mm diameter and 15 mm height. The tablet was pre-fired by being heated and oxidized at 500–1200° C., e.g. 700° C., for 8 hours in an oxidizing atmosphere such as in air.

Next, the tablet was finely ground in a ball mill to an average grain diameter of not more than 200 microns and preferably 20 microns or less, e.g. 10 microns or smaller. Then, the powder was pressed in a capsule at 50 Kg/cm² and formed into a cylindrical tablet again.

Main-firing was then carried out for 10–50 hours at 500–1200° C., for example 15 hours at 900° C., in an oxidizing atmosphere such as air. At the same time, electric power was applied to the tablet so that pulsed electric current was passed through the cylindrical tablet in its axial direction at 0.5–150 A/cm² for example 8 A/cm². Namely, the current flowed intermittently through the tablets for about 5 hours with 30 seconds pulse width and 5 minutes interval between pulses.

This tablet was observed mainly to have a perovskite-like structure, but a $K_2NiF_4$ structure was also found at the same time.

Then, the tablets were heated and reduced in an $O_2$ atmosphere with a 5–20 atom % Ar at 600–1200° C. for 3–30 hours, for example at 800° C. for 20 hours. The relationship between the temperature and the resistance was investigated, and as a result the highest Tc onset temperature and Tco were measured to be 103° K. and 81° K. respectively. After this reduction treatment, the presence of a $K_2NiF_4$ structure was conspicuously evident.

Example 6

The procedure of Example 5 was repeated but with 50% of Y substituted by Yb and with a current density of 2 A/cm². The Yb was introduced as an oxide. As a result, Tc onset was measured to be 107° K. and Tco was 84° K.

Example 7

The procedure of Example 6 was repeated but with $Nb_2O_5$ added to Y and Yb at 20–30% and with a suitable current which caused heat during the firing in order to elevate the temperature of the sample due to the current averagely by 50–300° C., for example 150° C. By virtue of these changes Tc was further elevated by 3–5° K.

The foregoing Examples are merely illustrative of the invention and do not include all of the combinations of elements and process variations which may be used to produce superconducting ceramics materials in accordance with the invention, other combinations also being effective to provide improved superconducting materials. While several embodiments have been specifically described, it is to be appreciated that the present invention is not limited to the particular examples described and that modifications and variations can be made without departure from the scope of the invention as defined by the appended claims. For example, a hollow cylinder may be used in place of the supporting cylinder 10 of FIG.2 and the inside surface of the cylinder may be coated with the superconductor so as to constitute a cooling surface whereupon the main-firing step and at the same time the current flowing step are effected. Furthermore, although pulsed current passing through the ceramic material in one direction is used in the described embodiments, the pulses could be passed alternately in opposite directions and alternating current or direct current can be also used.

I claim:

1. In a method of manufacturing a superconducting ceramic material, the method comprising mixing together the powdered chemical constituents of the required superconducting ceramic material; compacting said mixture; and firing said compacted powder wherein the improvement comprises the step of, during said firing, causing an electric current through the compacted mixture for ordering the atomic arrangement of the mixture into a simpler structure.

2. The method of claim 1 wherein the current is passed through the compacted mixture in the same direction as that in which the superconducting ceramic material is required to pass electric current.

3. The method of claim 1 further comprising pre-firing said mixture and grinding the pre-fired mixture into fine powder prior to the final compacting and firing of the mixture.

4. The method of claim 3 wherein said mixture is compressed into tablet form before said pre-firing step.

5. The method of claim 4 wherein said pre-firing is carried out in an oxidizing atmosphere.

6. The method of claim 4 wherein the average grain diameter of the ground mixture is no more than 200 microns.

7. The method of claim 6 wherein the average grain diameter of the ground mixture is 10 microns or less.

8. The method of claim 1 wherein said current is caused to flow as a sequence of pulses.

9. The method of claim 1 wherein said mixture is compacted into a cylinder and said current is caused to pass in the axial direction of said cylinder.

10. The method of any of claim 1 wherein said mixture is shaped into a coil.

11. The method of claim 10 wherein said current is caused to flow along said coil.

12. The method of claim 10 wherein said mixture is melted and delivered onto a turning roll in the form of a strip extending on the surface of said roll in the form of a coil.

13. The method of claim 12 wherein a voltage is applied between said turning roll and the molten mixture.

14. The method of claim 1 wherein said mixture is prepared in accordance with the stoichiometric formulae $(A_{1-x}B_x)_y Cu_z O_w$, where A is one or more elements of Group IIIb of the Periodic Table, e.g. the rare earth elements, B is one or more elements of Group IIa of the Periodic Table, e.g. the alkaline earth metals including beryllium and magnesium and x=0.1–1.0, y=2.0–4.0, z=1.0–4.0 and w=4.0–10.0.

15. The method of claim 14 wherein said electric current causes orientation in which the atomic arrangement is ordered so that few grain boundaries and imperfections exist.

16. The method of claim 15 wherein said electric current has the effect of providing a higher transition temperature.

17. The method of claim 1 wherein said electric current is a direct current.

18. The method of claim 1 wherein said electric current is a pulsed current.

19. The method of claim 1 wherein the (a,b) plane of the ceramic material is oriented substantially parallel to the direction of said electric current.

20. In a method of manufacturing a superconducting ceramic material, the method comprising mixing together the powdered chemical constituents of the required superconducting ceramic material; compacting said mixture; pre-firing said compacted mixture; grinding said pre-fired mixture into a fine powder; compacting said fine powder into a predetermined form; and firing said compacted powder wherein the improvement comprises the step of, at the same time as said firing, causing the passage of an electric current through the compacted powder for ordering the atomic arrangement of the mixture into a simpler structure.

21. A method of claim 20 wherein the firing temperature is chosen to be between 500° and 1000° C.

22. The method of claim 20 wherein said mixture is prepared in accordance with the stoichiometric formulae $(A_{1-x}B_x)_y Cu_z O_w$, where A is one or more elements of Group IIIb of the Periodic Table, e.g. the rare earth elements, B is one or more elements of Group IIa of the Periodic Table, e.g. the alkaline earth metals including beryllium and magnesium and x=0.1–1.0, y=2.0–4.0, z=1.0–4.0 and w=4.0–10.0.

23. The method of claim 22 wherein said electric current causes orientation in which the atomic arrangement is ordered so that few grain boundaries and imperfections exist.

24. The method of claim 23 wherein said electric current has the effect of providing a higher transition temperature.

25. The method of claim 20 wherein said electric current is a direct current.

26. The method of claim 20 wherein said electric current is a pulsed current.

27. The method of claim 20 wherein the (a,b) plane of the ceramic material is oriented substantially parallel to the direction of said electric current.

28. The method of claim 20, wherein the ordering of the atomic structure simplifies the atomic structure on the (a,b) plane so that few grain boundaries and imperfections exist in the final ceramic material.

29. The method of claim 20, wherein the ordering of the atomic structure raises the Tc.

30. The method of claim 1 where said firing occurs within a temperature range of 500–1200° C.

31. The method of claim 20 where said firing of said compacted powder at the same time the electric current is passed therethrough occurs within the temperature range of 500–1200° C.

* * * * *